(12) United States Patent
Park et al.

(10) Patent No.: US 7,723,809 B2
(45) Date of Patent: May 25, 2010

(54) SILICON-BASED RF SYSTEM AND METHOD OF MANUFACTURING THE SAME

(75) Inventors: Yun-kwon Park, Dongducheon-si (KR); Sang-wook Kwon, Seongnam-si (KR); Duck-hwan Kim, Goyang-si (KR); Jong-seok Kim, Gyeonggi-do (KR); Sung-hoon Choa, Seoul (KR); In-sang Song, Seoul (KR)

(73) Assignee: Samsung Electronics Co., Ltd., Suwon (KR)

( * ) Notice: Subject to any disclaimer, the term of this patent is extended or adjusted under 35 U.S.C. 154(b) by 1008 days.

(21) Appl. No.: 11/342,564

(22) Filed: Jan. 31, 2006

(65) Prior Publication Data

US 2006/0180897 A1    Aug. 17, 2006

(30) Foreign Application Priority Data

Feb. 14, 2005    (KR) ...................... 10-2005-0011901

(51) Int. Cl.
*H01L 29/78* (2006.01)
(52) U.S. Cl. ................ 257/414; 257/619; 257/E25.027
(58) Field of Classification Search ................ 257/499, 257/503, 508, 531, 532, 533, 536, 774, 414–419, 257/E25.027, E25.031
See application file for complete search history.

(56) References Cited

U.S. PATENT DOCUMENTS

2003/0020173 A1*  1/2003  Huff et al. ..................... 257/774
2003/0134449 A1*  7/2003  Huibers ........................ 438/52

* cited by examiner

*Primary Examiner*—Brook Kebede
(74) *Attorney, Agent, or Firm*—Sughrue Mion, PLLC

(57) ABSTRACT

A RF system which includes a silicon substrate formed with at least one via-hole filled with conductive material so that both sides of the silicon substrate are electrically connected with one another; at least one flat device formed on one side of the silicon substrate; and at least one RF MEMS device formed on the other side of the silicon substrate.

15 Claims, 3 Drawing Sheets

US 7,723,809 B2

SILICON-BASED RF SYSTEM AND METHOD OF MANUFACTURING THE SAME

CROSS-REFERENCE TO RELATED APPLICATIONS

This application claims the benefit of Korean Patent Application No. 2005-11901 filed Feb. 14, 2005 in the Korean Intellectual Property Office, the disclosure of which is incorporated herein by reference.

BACKGROUND OF THE INVENTION

1. Field of the Invention

The present invention relates to a RF system implemented on a single silicon-based chip and a method for manufacturing the same.

2. Description of the Related Art

With the recent rapid development of communication technologies, there is a need for corresponding development of RF (Radio Frequency) device technologies. In particular, due to multi-functionalization, there is a demand for miniaturization and integration of wireless communication terminals such as mobile phones. For this reason, nowadays, micro-machining of electronic devices through MEMS (Micro Electrical Mechanical System) technologies is performed as practiced by those of ordinary skill in the art.

Individual electronic devices processed in this manner are integrated on a LTCC (Low Temperature Co-fired Ceramic) substrate or a MLB (Multi-Layer Board) substrate formed by laminating plural PCBs (Printed Circuit Boards) to implement a RF system. The RF system implemented on such a LTCC substrate or MLB substrate forms a predetermined circuit therein through an inductor, a capacitor or the like implemented in a two-dimensional structure, and various active devices such as a LNA (Low Noise Amplifier), PA (Power Amplifier), or the like and RF MEMS devices such as a filter, switch, duplexer or the like which are three-dimensional devices are formed on top of the RF system.

The above-mentioned RF system is formed with a separate protective film for protecting the three-dimensional RF MEMS devices, in which no device is formed in the protective film. For this reason, there is a limit in integrating and miniaturizing such a RF system.

In addition, there is a disadvantage in that the size of the RF system is increased because various active devices and RF MEMS devices are two-dimensionally arranged on the top side of the LTCC substrate or MLB substrate.

Furthermore, the RF MEMS devices are formed through a silicon process, whereas the LTCC board is formed through a LTCC process in which ceramic and glass materials are mixed and fired. Therefore, in order to implement a RF system on such a LTCC substrate, there is a demand to form RF MEMS devices through a silicon process, to form a LTCC substrate by performing a LTCC process, and then to bond the RF MEMS to the LTCC board. Meanwhile, in order to implement a RF system on a MLB substrate, a MLB process is performed to form a MLB substrate, in which process plural PCBS, each of which is formed with a predetermined circuit pattern, are laminated and then drilled to form interlayer electric interconnections. Then, RF devices formed through a silicon process are bonded to the MLB substrate. Because different kinds of processes are required to implement a RF system, the manufacturing processes of such a RF system are difficult to perform and the manufacturing costs thereof are increased.

For this reason, various research has recently been proposed to implement such a RF system through the same kinds of processes such as a silicon process.

SUMMARY OF THE INVENTION

Accordingly, the present invention has been made to solve the above-mentioned problems, and an object of the present invention is to provide a RF system which can be manufactured through the same kind of process and a method for manufacturing the same.

Another object of the present invention is to provide a RF system which is advantageous in miniaturization and a method of manufacturing the same.

Yet another object of the present invention is to provide a RF system which is easy to manufacture and makes it possible to lower manufacturing costs.

In order to achieve the above-mentioned objects, the present invention provides a RF system comprising: at least one silicon substrate; and plural RF devices respectively formed on either side of the silicon substrate.

According to an embodiment of the present invention, the at least one silicon substrate comprises one substrate (i.e. . . the substrate is solely a single substrate), and the plural RF devices comprise: one or more flat devices formed on one side of the silicon substrate; and one or more RF MEMS devices formed on the other side of the silicon substrate to be electrically connected with the flat devices.

The flat devices may include at least one active device and at least one passive device, wherein the at least one active device includes at least one of a PA and a LNA, and the at least one passive device includes at least one of an inductor, a capacitor, a resistor, and an antenna. In addition, the silicon substrate is formed with at least one groove for electric isolation from the RF MEMS devices and one or more via-holes for electrically interconnecting the RF MEMS devices and the flat devices.

According to another embodiment of the present invention, the one side of the silicon substrate is formed with a groove and the flat devices are formed in the groove.

According to another embodiment of the present invention, the at least one silicon substrate comprises a first silicon substrate formed with a groove on one side thereof, a second silicon substrate bonded to the one side of the first silicon substrate, and a third silicon substrate having one side bonded to the other side of the first silicon substrate to be electrically connected with the first silicon substrate, wherein the RF devices are formed in the groove. The RF devices may comprise: one or more first flat devices formed on the one side of the first silicon substrate; and one or more RF MEMS devices formed on the surface of the second silicon substrate facing the first silicon substrate; one or more second flat devices formed on the other side of the first silicon substrate; and one or more third flat devices formed on the other side of the third silicon substrate.

In addition, the first and third silicon substrates are respectively formed with one or more via-holes filled with conductive material and an insulation layer is interposed between the first and third silicon substrates. Meanwhile, each of the first to third flat devices preferably includes at least one of a PA, a LNA, an inductor, a capacitor, a resistor and an antenna.

In order to achieve the above-mentioned objects, the present invention also provides a method of manufacturing a RF system which comprises: a) forming one or more flat devices on one side of a silicon substrate; b) electrically connecting first and second sides of the silicon substrate; and c) forming one or more RF MEMS devices on the second side of the silicon substrate.

According to an embodiment of the present invention, the step a) comprises: patterning one or more flat devices on the first side of the silicon substrate, and the step b) comprises: b-1) coating a sacrificial layer on the first side of the silicon substrate to protect the flat devices; b-2) forming at least one via-hole through the silicon substrate; and b-3) filling the at least one via-hole with conductive material. In addition, in the step b-3), the conductive material is filled in the at least one via-hole by sputtering. The step c) comprises: forming at least one groove on the second side of the silicon substrate; forming at least one RF MEMS device atop of the groove; and removing the sacrificial layer.

According to another embodiment of the present invention, the step a) comprises: forming a groove on the first side of the silicon substrate; and patterning the flat devices in the groove.

In order to achieve the above-mentioned objects, the present invention also provides a method of manufacturing a RF system which comprises: A) preparing first, second and third substrates; B) forming a groove on a first side of the first silicon substrate and forming at least one first flat device and at least one second flat device on a second side of the first silicon substrate to fabricate a first silicon substrate assembly; C) forming at least one RF MEMS device on a first side of the second silicon substrate to fabricate a second silicon substrate assembly; D) forming a third flat device on a first side of the third silicon to fabricate a third silicon substrate assembly; and E) bonding the first, second and third silicon substrate assemblies to each other so that the at least one RF MEMS device is positioned within the groove.

According to another embodiment of the present invention, the step B) comprises: B-1) etching a groove in a predetermined depth on the first side of the first silicon substrate; B-2) forming the at least one first flat device in the groove; B-3) forming the at least one second flat device on the second side of the first silicon substrate; B-4) electrically connecting first and second sides of the first silicon substrate with each other; and B-5) forming an insulation film on the second side of the first silicon substrate. In addition, the step B-4) comprises steps of: forming at least one first via-hole through the first silicon substrate; filling the at least one first via-hole with conductive material; and forming at least one solder ball atop of the at least one first via-hole filled with the conductive material, and the step D) comprises: forming at least one third flat device on the third silicon substrate; forming at least one second via-hole through first and second sides of the third silicon substrate; and filling the second via-hole with conductive material. The step E) may comprise: bonding the second silicon substrate assembly to one side of the first silicon substrate assembly; and E-2) bonding the third silicon substrate assembly to the second side of the first silicon substrate, wherein the steps E-1) and E-2) may employ a metal fusion bonding method.

BRIEF DESCRIPTION OF THE DRAWINGS

The above aspects and features of the present invention will be more apparent from the description of certain embodiments of the present invention in reference to the accompanying drawings, in which.

DETAILED DESCRIPTION OF THE PREFERRED EMBODIMENTS

Figure 1A:
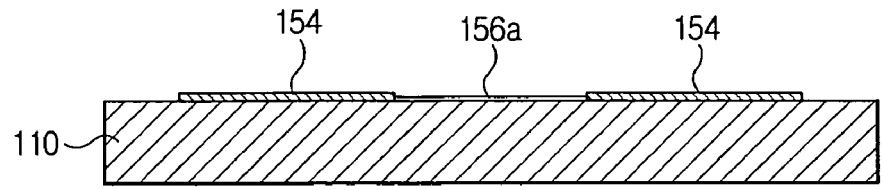
FIGS. 1A to 1D are process views illustrating a method of manufacturing a RF system according to a first embodiment of the present invention.

Hereinbelow, embodiments of the present invention are described in detail with reference to accompanying drawings. However, the present invention should not be construed as being limited thereto.

Referring to FIG. 1, a RF system according to a first embodiment of the present invention includes a silicon substrate 110 and one or more RF devices respectively formed on either side of the silicon substrate 110.

The silicon substrate 110 is formed with two grooves 112 on one side of the silicon substrate for electric isolation of the silicon substrate from the RF devices, and one or more via-holes 114 through the silicon substrate 110. The via-holes 114 are filed with conductive material 116.

The RF devices include two RF MEMS devices 158, wherein each RF MEMS device 158 has a three-dimensional structure because it is fabricated by being stacked with four flat devices 152. In the present embodiment, the numbers of the flat devices 152 and the RF MEMS devices 158 are defined as four and two, respectively. However, the numbers can be increased or reduced according to the characteristics of the RF system.

The flat devices 152 include two active devices 154 formed on the bottom side of the silicon substrate 110, a first passive device 156a for interconnecting the two active devices 154 in such a way that a signal can be communicated between the two active devices 154, and a second passive device 156b for interconnecting the two RF MEMS devices 158 in such a way that a signal can be communicated between the two RF MEMS devices 158. Each of the active devices 154 may be a PA, a LNA, etc. and the first and second passive devices 156a, 156b may be an inductor, a capacitor, an antenna, a resistor, a transmission line, etc.

The RF MEMS devices 158 are directly formed on one side of the silicon substrate 110 through a MEMS technology. More specifically, the MEMS devices 158 are formed atop and on one side of the grooves 112 to electrically isolate the RF MEMS devices 158 from the silicon substrate 110. Although the grooves 112 are employed as electrical isolation means in the present embodiment, various isolation means such as insulation film can be alternatively employed. In addition, because they are electrically connected with the conductive material filled in the via-holes 114, the RF MEMS devices 158 can be electrically connected with the active devices 154 formed on the other side of the silicon substrate 110. Then, the two RF MEMS devices 158 are electrically interconnected through the second passive device 156b. The RF MEMS devices 158 may comprise various filters, switches, duplexers, etc.

Because the RF devices are respectively formed on either side of the silicon substrate, it is possible to increase the integration rate per unit area of the silicon substrate, thereby lowering manufacturing costs.

Now, the method of manufacturing the RF system according to the above-mentioned embodiment of the present invention is described.

Referring to FIG. 1A, to manufacture the RF system according to the present embodiment, the two active devices 154 and the first passive device 156a for electrically interconnecting the two active devices 154 are firstly formed on the other side of the prepared silicon substrate 110. More specifically, the active devices 154 and the passive device 156a are formed by being sequentially patterned. Since the patterning can be implemented through various well-known technologies such as photolithography and etching, detailed description thereof is omitted.

Figure 1B:
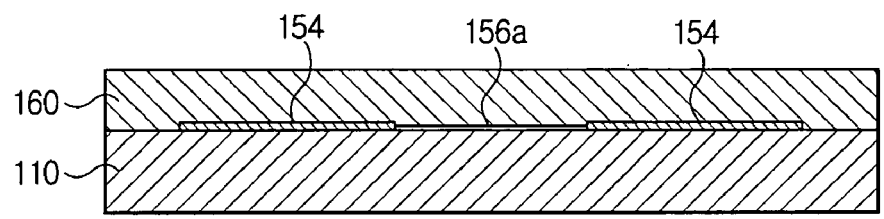

Referring to FIG. 1B, a sacrificial layer 160 is formed on the other side of the silicon substrate 110. This is to prevent the active devices 154 and the first passive device 156a formed on the other side of the silicon substrate 110 from being damaged by coming into contact with a substrate holder or the like when forming the RF MEMS devices 158 (see FIG. 1D) on the one side of the silicon substrate. For the sacrificial layer 160, it is possible to employ a photoresist or epoxy film, a nitride film or an oxide film.

Figure 1C:
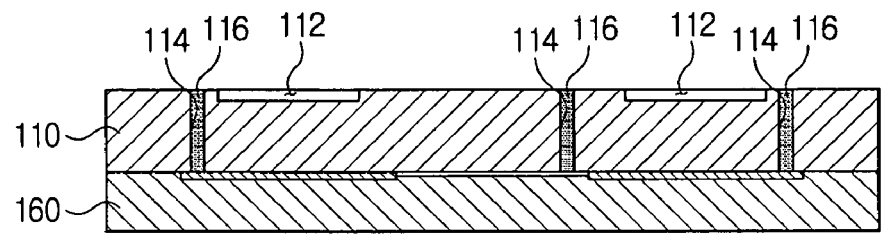
Figure 1D:
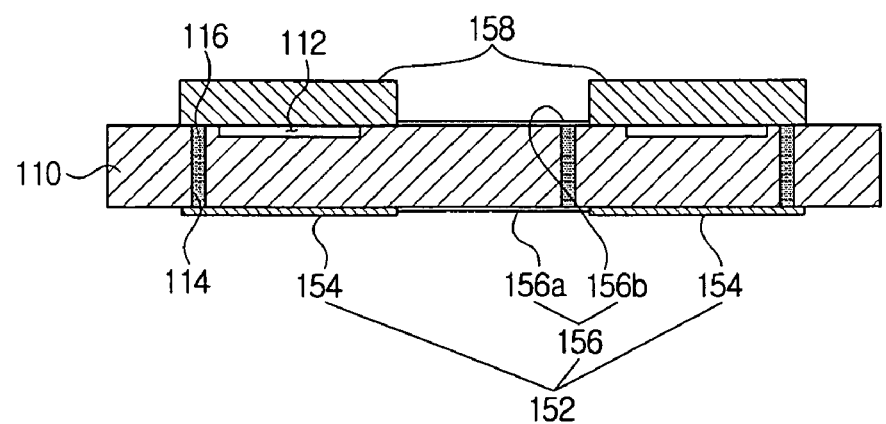

Referring to FIG. 1C, the silicon substrate 110 is turned over so as to form the corresponding devices on the one side of the silicon substrate 110. Then, the one or more via-holes 114 are formed through the silicon substrate 110. The via-holes 114 can be formed through various etching processes. Next, conductive material 116 can be filled in the via-holes 114 by plating or sputtering. Then, the two grooves 112 for electric isolation are formed on the one side of the silicon substrate 110. Such grooves 112 are formed to have a predetermined size and shape through a photolithographic process and an etching process Referring to FIG. 1D, the second passive device 156b is patterned and formed on the one side of the silicon substrate 110. Then, the two RF MEMS devices 158 are sequentially formed atop of the grooves 112 so that they can be respectively electrically connected with the second passive device 156b. Meanwhile, it is possible to form a separate insulation film (not shown) on the surface, where the RF MEMS devices 158 are supported. Then, the sacrificial layer 160 (see FIG. 1C) is removed by wet etching, thereby completing fabrication of the RF system. Meanwhile, it is possible to additionally form a cap or the like for protecting the RF MEMS devices 158.

Because the RF MEMS devices 158 are directly formed on the silicon substrate 110 on which a RF system will be directly formed, it is possible to simplify a conventional complicated process in which it is necessary to perform different types of processes. Such different types of processes might include a semiconductor process for forming separate MEMS devices 158 and a process for locating the finished RF MEMS devices 158 on a LTCC substrate or a MLB substrate for forming the RF system. That is, because the RF devices 150 are integrated on the silicon substrate 110, it is possible to manufacture a RF system through the same types of processes.

Now, a RF system according to a second embodiment of the present invention and a method of manufacturing the same are described in detail with reference to FIGS. 2A to 2D.

Figure 2A:
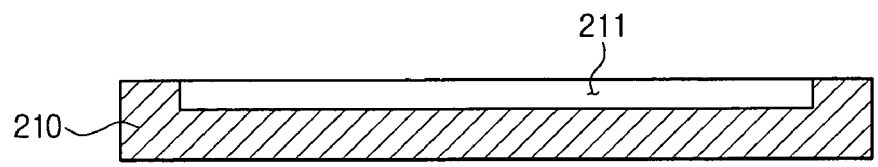
FIGS. 2A to 2D are process views illustrating a method of manufacturing a RF system according to a second embodiment of the present invention.
Figure 2B:
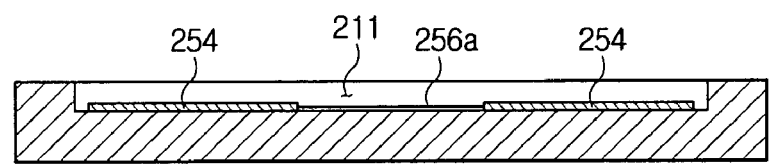
Figure 2C:
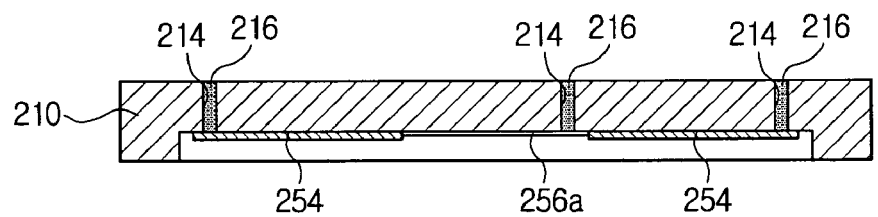
Figure 2D:
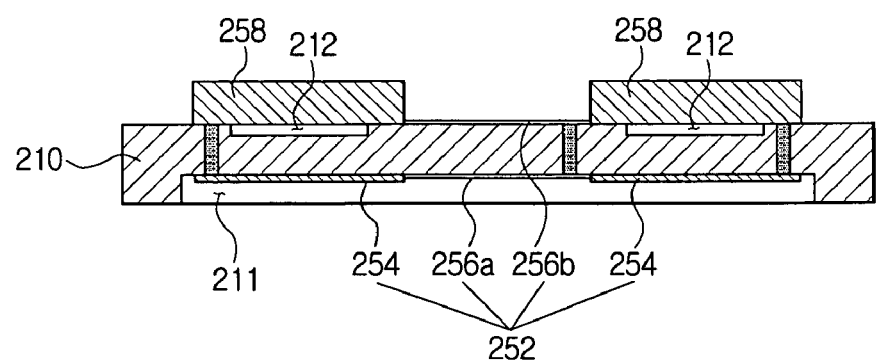

Referring to FIG. 2D, a RF system according to the second embodiment of the present invention is different from the first embodiment in that a first groove 211 is formed on the other surface of the silicon substrate 210 and active devices 254 and a first passive device 256a, which are flat devices, are formed in the first groove 211. Because the first groove 211 is formed, this feature has an advantage in that it is not necessary to form a sacrificial layer for protecting the devices formed on the other side of the silicon substrate 210 unlike the first embodiment.

Referring to FIG. 2A, the method of manufacturing the RF system according to the second embodiment of the present invention firstly employs a photolithographic process and an etching process to form the first groove 211 on the other side of the silicon substrate.

Referring to FIG. 2B, two active devices 254 and one passive device 256a are formed in the first groove with the same method as the first embodiment.

Referring to FIG. 2C, the silicon substrate 210 is worked on to form the via-holes 214 on the one side of the silicon substrate, and then the via-holes 214 are filled with conductive material 216, like the first embodiment of the present invention. At this time, because the active devices 254 and the passive device 256a are formed in the first groove formed on the other side of the silicon substrate 210, the active devices 254 and the first passive device 256a are not damaged by a substrate holder or the like even if the silicon substrate is worked on.

Referring to FIG. 2D, second grooves 212 are formed on the one side of the silicon substrate 210 for electric isolation and RF MEMS 258 and a second passive device 256b are respectively formed, like the first embodiment of the present invention.

Because the first groove 211 is previously formed, the process for forming a sacrificial layer can be omitted, whereby the process for fabricating a RF system is simplified.

Now, a RF system according to a third embodiment of the present invention and a method of manufacturing the same are described in detail.

Figure 3A:
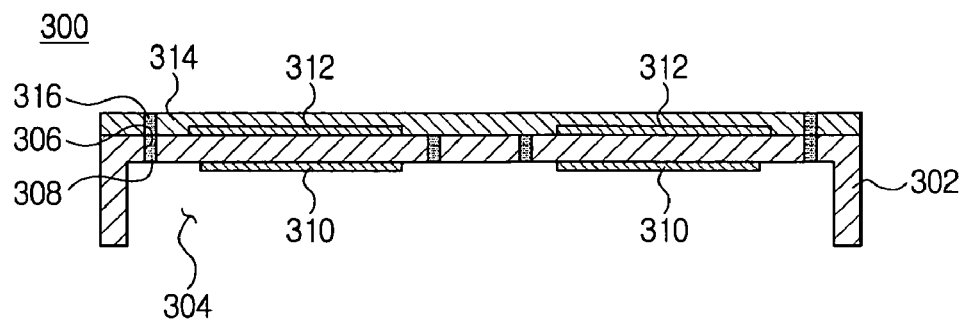
FIGS. 3A to 3D are process views illustrating a method of manufacturing a RF system according to a third embodiment of the present invention.
Figure 3B:
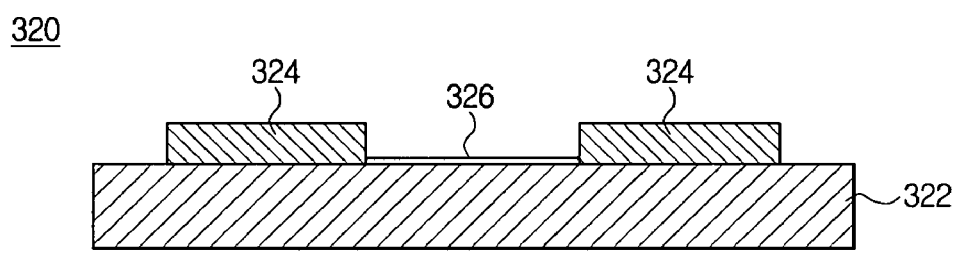
Figure 3C:
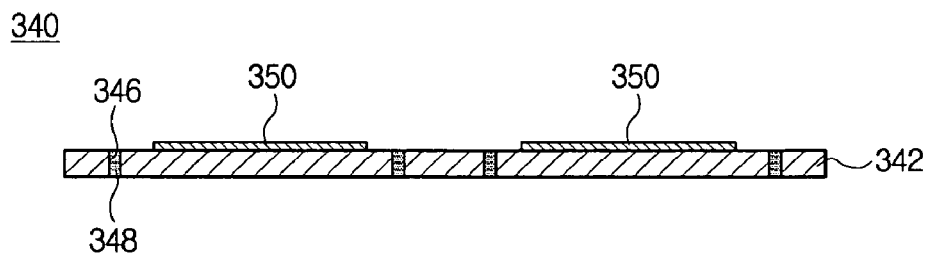
Figure 3D:
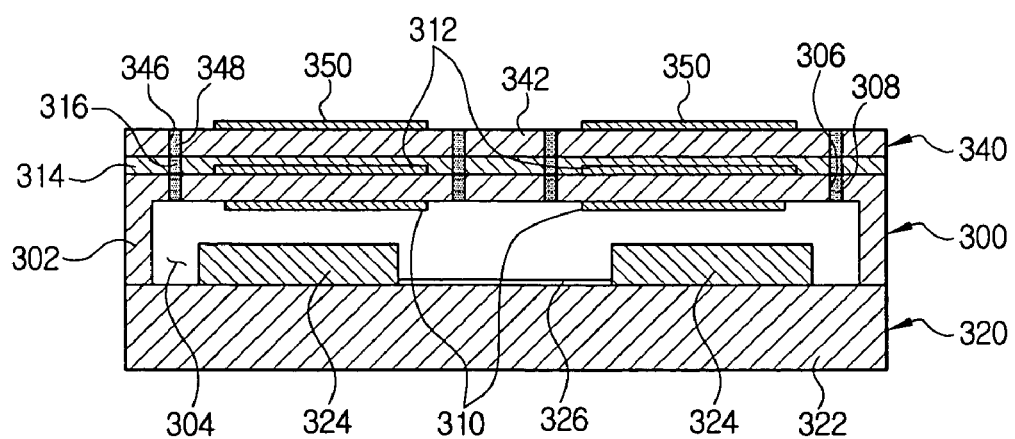

Referring to FIG. 3D, the RF system according to the third embodiment of the present invention includes a first silicon substrate assembly 300, a second silicon substrate assembly 320 bonded to the bottom side of the first silicon substrate assembly 300, and a third silicon substrate assembly 340 bonded to the top side of the first silicon substrate assembly 300.

The first silicon substrate assembly 300 includes a first silicon substrate 302, one or more first flat devices 310 formed on one side of the first silicon substrate 302, one or more second flat devices 312 formed on the other side of the first silicon substrate 302, and an insulation film 314 for isolating the second flat devices 312 and the second silicon substrate assembly 320.

A groove 304 is formed on the one side of the first silicon substrate 302 and the first flat devices 310 are formed in the groove 304. Then, one or more via-holes 306 are formed and filled with first conductive material 308 so as to electrically interconnect the top and bottom sides of the first silicon substrate 302.

The first flat devices 310 comprise two passive devices, which may be any of an inductor, a capacitor, a resistor and a transmission line. In addition, the two passive devices can be electrically connected with each other by a circuit pattern formed on the one side of the first silicon substrate 302 in a predetermined pattern. Furthermore, an insulation film can be formed on the one side of the first silicon 302, so that the first passive devices and the first silicon substrate 302 can be electrically insulated from each other.

The second flat devices 312 comprise two active devices, which may be a PA, a LNA, etc. The two active devices can be also electrically connected with each other through a circuit pattern formed on the other side of the first silicon substrate 302, and an insulation film may be interposed between the active devices and the first silicon substrate 302.

The insulation film 314 can employ various insulation materials such as an oxide film, an epoxy film, a nitride film, etc. In addition, solder balls 316 are formed on the insulation film 314 to correspond to the first via-holes 306 filled with the first conductive material 308. The solder balls 316 are formed to contact the first conductive material 308, so that the top side and the bottom side of the insulation film 314 can be electrically connected with one another.

The second silicon assembly 320 includes a second silicon substrate 322 and one or more RF MEMS devices 324 formed on the top side of the second silicon substrate 322.

An insulation film (not shown) can be formed on the top side of the second silicon substrate 322 to insulate the RF MEMS devices 324 and the second silicon substrate 322, and a circuit of a predetermined pattern (not shown) is formed on the insulation film so as to be electrically connected with the first silicon substrate 302.

A pair of the RF MEMS devices 324 are formed to be positioned within the groove 304 formed on the one side of the first silicon substrate 302 and electrically connected with one another via the passive device 326. In this manner, the RF MEMS devices 324 are positioned within the groove 304 to serve as an existing package substrate for protecting the RF MEMS devices 324. This arrangement allows for savings in manufacturing cost because it is possible to omit a separate substrate for an existing package. Furthermore, it is further advantageous in miniaturization. Such RF MEMS devices 324 may comprise a filter, a switch and a duplexer.

The third substrate assembly includes a third silicon substrate 342 and one or more third flat devices 350 formed on the top side of the third silicon substrate 342.

The third silicon substrate 342 is formed with one or more second via-holes 346 filled with second conductive material 348 which is in contact with the solder balls 316. Therefore, the first silicon substrate 302 and the second silicon substrate 322 are electrically connected with one another via a circuit pattern (not shown), and the first silicon substrate 302 and the third silicon substrate 342 are interconnected with one another through the first via-holes 306, the solder balls 316 and the second via-holes 346.

A pair of the third flat devices 350 are formed on the top side of the third silicon substrate 342 and each electrically connected by an unillustrated circuit pattern. Each of the third flat devices 350 may be an antenna and a mixer which is an active device. However, it is possible to variously modify and use the above-mentioned first and second flat devices 310, 312 as well as the third flat devices 350 according to the characteristics and functions of a RF system, beyond the above-mentioned applications.

Now, the RF system according to the third embodiment of the present invention and the method of manufacturing the same is described.

In the method of manufacturing the RF system, it is necessary to firstly fabricate the first, second and third substrate assemblies 300, 320, 340 as shown in FIGS. 3A to 3D. Such fabrication progresses after firstly preparing the first, second and third silicon substrates 302, 322, 342 by polishing each to a proper thickness.

Referring to FIG. 3A, in the first silicon substrate assembly 300, the first silicon substrate 302 is firstly formed with the groove 304 in the one side thereof using an etching process, etc. Then, the first flat devices 310 are formed in the groove 304. The first flat devices 310 can be formed using various semiconductor processes such as depositing a predetermined circuit pattern or the like depending on the type of the devices. Next, the second flat devices 312 are formed on the other side of the first silicon substrate 302. Then, the via-holes 306 are formed through the first silicon substrate 302 using an etching process or the like, and the first conductive material 308 is filled in the first via-holes 306 by a process such as plating or sputtering. Then, the solder balls 316 are formed to contact the first conductive material 308 and the insulation film 314 is formed over the second flat devices 312 including the solder balls 316. At this time, because the second flat devices 312 are very thin, the insulation film 314 is formed in a thickness which is substantially thin as compared to that shown in FIG. 3A. Through this procedure, the first silicon substrate assembly 300 is completed.

Referring to FIG. 3B, in the second silicon substrate assembly 320, at least one RF MEMS device 324 and the passive device 326 for interconnecting the RF MEMS devices 324 are formed in the second silicon substrate 322. In this manner, because the RF MEMS devices 324 are directly formed in the second silicon substrate 322 as in the first and second embodiments described above, the same types of processes can be employed, whereby the entire process of manufacturing a RF system can be easily performed. The MEMS devices 324 can be formed using the same types of processes as those employed in the first and second embodiments of the invention.

Referring to FIG. 3C, in the third silicon substrate assembly 340, the third flat devices 350 are formed on the top side of the third silicon substrate 342. Then, one or more second via-holes 346 are formed through the third silicon substrate 342, and the second conductive material 348 is filled in the second via-holes 346 by plating or sputtering. Through this process, the third silicon substrate assembly 340 is completed.

Once the first, second and third silicon substrate assemblies 300, 320, 340 are completed as described above, the respective silicon substrate assemblies 300, 320, 340 are bonded to one another. At first, the one side of the first silicon substrate assembly 300 is bonded to the one side of the second silicon substrate assembly 320. At this time, the RF MEMS devices 324 will be positioned within the groove 304. Then, the third silicon substrate assembly 340 is bonded to the sub-assembly of the first and second silicon substrate assemblies 300, 320. In this event, the first conductive material filled in the first via-holes 306, the solder balls 316 and the second conductive material 348 filled in the second via-holes 346 will be electrically connected with one another. In the process of bonding the first, second and third silicon substrate assemblies 300, 320, 340, it is preferable to employ a metal fusion bonding method (e.g., metal fusion bonding of the silicon substrate assemblies plated at their contacting portions with a metal such as Au, Au/Sn alloy, etc.) which can be performed at a relatively low temperature and thus can reduce damage to the devices, wherein the metal (i.e., the blended metallic zone interconnecting the respective assemblies) can be Au—Au, Au/Sn—Au/Sn, Au/Sn—Au, etc.

By three-dimensionally forming a RF system as described above, it is possible to implement a more highly integrated RF system.

As disclosed above, according to the present invention, because a RF system can be manufactured solely with a silicon process, the entire manufacturing process is simplified, whereby manufacturing cost can be lowered.

In addition, because RF MEMS devices are directly formed on a silicon substrate, the number of steps included in manufacturing a RF system can be reduced.

Furthermore, because devices are arranged on either side of a substrate, high density integration can be realized, which is advantageous in miniaturization of a RF system.

Meanwhile, because the first silicon substrate also serves as a package substrate for protecting the RF MEMS devices, it is advantageous not only in miniaturization but also in lowering manufacturing cost including material costs.

Moreover, because the RF MEMS devices are arranged in a three-dimensional structure in which respective substrates are stacked, the present invention is highly advantageous in terms of integration.

Although several embodiments of the present invention have been shown and described in order to exemplify the principle of the present invention, the present invention is not limited to the above-described specific embodiments. It will be understood that various modifications and changes can be made by one skilled in the art without departing from the spirit and scope of the invention as defined by the appended claims. Therefore, it shall be considered that such modifications, changes and equivalents thereof are included within the scope of the present invention.

What is claimed is:

1. An RF system comprising:
    at least one silicon substrate; and
    plural RF devices respectively formed on either side of the silicon substrate,
    wherein the RF devices comprise one or more flat devices formed on one side of the at least one silicon substrate, and
    wherein the at least one silicon substrate is formed with at least one groove and the flat devices are formed in the groove.

2. The RF system as claimed in claim 1, wherein the at least one silicon substrate comprises one substrate, and the RF devices further comprise
    one or more RF MEMS devices formed on the other side of the silicon substrate to be electrically connected with the flat devices.

3. The RF system as claimed in claim 2, wherein the flat devices include at least one active device and at least one passive device.

4. The RF system as claimed in claim 3, wherein the active device includes at least one of a PA and a LNA, and the passive device includes at least one of an inductor, a capacitor, a resistor, and an antenna.

5. An RF system comprising:
    at least one silicon substrate; and
    plural RF devices respectively formed on either side of the silicon substrate,
    wherein the at least one silicon substrate comprises one substrate,
    wherein the RF devices comprise:
        one or more flat devices formed on one side of the silicon substrate; and
        one or more RF MEMS devices formed on the other side of the silicon substrate to be electrically connected with the flat devices, and
    wherein the silicon substrate is formed with at least one groove for electric isolation of the silicon substrate from the RF MEMS devices.

6. The RF system as claimed in claim 2, wherein the silicon substrate is formed with one or more via-holes filled with a conductive material for electrically interconnecting the RF MEMS devices and the flat devices.

7. An RF system comprising:
    at least one silicon substrate; and
    plural RF devices respectively formed on either side of the silicon substrate,
    wherein the at least one silicon substrate comprises a first silicon substrate formed with a groove on one side thereof, and a second silicon substrate bonded to the one side of the first silicon substrate, and wherein the RF devices are formed in the groove.

8. The RF system as claimed in claim 7, wherein the RF devices comprise:
    one or more first flat devices formed on the one side of the first silicon substrate; and
    one or more RF MEMS devices formed on a surface of the second silicon substrate facing the first silicon substrate.

9. The RF system as claimed in claim 8, further comprising one or more second flat devices formed on the other side of the first silicon substrate.

10. The RF system as claimed in claim 9, further comprising a third silicon substrate having one side bonded to the other side of the first silicon substrate in such a way that the one side of the third silicon substrate is electrically connected with the first silicon substrate, wherein the RF devices further comprise one or more third flat devices formed on the other side of the third silicon substrate.

11. The RF system as claimed in claim 10, wherein the first and third silicon substrates are respectively formed with one or more via-holes filled with conductive material.

12. The RF system as claimed in claim 11, further comprising an insulation layer interposed between the first and third silicon substrates.

13. The RF system as claimed in claim 12, wherein the first to third flat devices each comprises at least one of a PA, a LNA, an inductor, a capacitor, a resistor and an antenna.

14. A RF system comprising:
    a silicon substrate having a first groove formed on one side thereof, at least one second groove formed on the other side, and one or more via-holes filled with conductive material so that both sides of the silicon substrate are electrically connected with one another;
    one or more flat devices formed in the first groove; and
    one or more RF MEMS devices formed atop of the at least one second groove so as to be electrically isolated from the silicon substrate.

15. A RF system comprising:
    a first silicon substrate having a groove on a first side thereof, within which one or more first flat devices are formed, a second flat device formed on a second side thereof, and at least one first via-hole filled with conductive material so that both sides of the first silicon substrate are electrically connected with one another;
    a second silicon substrate bonded to the first side of the first silicon substrate to be electrically connected with the first silicon substrate and formed with at least one RF MEMS device positioned within the groove; and
    a third silicon substrate bonded to the second side of the first silicon substrate to be electrically connected with the silicon substrate and formed with at least one second via-hole filled with conductive material so that both sides of the third silicon substrate are electrically connected with one another, the third silicon substrate further comprising at least one third flat device formed on one side thereof.

* * * * *